(12) United States Patent
Diercks et al.

(10) Patent No.: US 7,259,565 B2
(45) Date of Patent: Aug. 21, 2007

(54) TESTING AN ELECTRICAL SWITCHGEAR SYSTEM

(75) Inventors: Melissa Ann Diercks, Hamden, CT (US); David G Fletcher, Simsbury, CT (US); Ioan Marusca, Markham (CA)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/662,725

(22) Filed: Sep. 15, 2003

(65) Prior Publication Data

US 2005/0057254 A1    Mar. 17, 2005

(51) Int. Cl.
*G01R 31/02* (2006.01)
*G01R 31/327* (2006.01)
*H02H 3/00* (2006.01)

(52) U.S. Cl. ............... 324/424; 324/415; 324/527; 361/79

(58) Field of Classification Search ............... 324/424; 361/92, 91.1, 86–87, 79, 90
See application file for complete search history.

(56) References Cited

U.S. PATENT DOCUMENTS

| | | | | |
|---|---|---|---|---|
| 4,689,570 A | | 8/1987 | Ohgaki et al. ............... 324/418 |
| 4,814,712 A | * | 3/1989 | Burton et al. ............... 324/424 |
| 5,168,261 A | * | 12/1992 | Weeks ............... 340/515 |
| 5,479,315 A | * | 12/1995 | Schweitzer, III ............... 361/62 |
| 5,737,168 A | * | 4/1998 | Baker ............... 361/90 |
| 5,742,513 A | * | 4/1998 | Bouhenguel et al. ............... 700/286 |
| 6,169,649 B1 | * | 1/2001 | Fasullo et al. ............... 361/115 |
| 6,266,219 B1 | * | 7/2001 | Macbeth et al. ............... 361/42 |
| 6,472,882 B1 | * | 10/2002 | Tiemann et al. ............... 324/509 |
| 6,631,063 B2 | * | 10/2003 | Ortiz et al. ............... 361/79 |
| 6,798,209 B2 | * | 9/2004 | Lavoie et al. ............... 324/424 |
| 2003/0132753 A1 | | 7/2003 | Fletcher et al. ............... 324/424 |

FOREIGN PATENT DOCUMENTS

EP    0337235    4/1989

\* cited by examiner

*Primary Examiner*—Anjan Deb
*Assistant Examiner*—John Zhu
(74) *Attorney, Agent, or Firm*—Ohlandt, Greeley, Ruggiero & Perle, L.L.P.

(57) ABSTRACT

There is provided a method of testing an electrical switchgear system. A node in the electrical switchgear system monitors a power line signal and controls a breaker based on the power line signal. The method includes applying an analog signal to the node, and receiving data representing a status of the breaker. The analog signal simulates the power line signal.

28 Claims, 2 Drawing Sheets

TESTING AN ELECTRICAL SWITCHGEAR SYSTEM

BACKGROUND OF THE INVENTION

1. Field of the Invention

The present disclosure relates to electrical distribution equipment, and more particularly, to testing components in an electrical switchgear system.

2. Description of the Related Art

A switchgear system receives electrical power from an electric utility company and distributes the electrical power at a customer site. Such a system typically includes devices such as current transformers (CT), potential transformer (PT), also known as voltage transformers, human machine interface devices to display metering data, e.g., kilowatts-hours, circuit breakers, and protection relays in addition to circuit breakers.

The switchgear system also includes a controller, referred to as a node, associated with each circuit breaker. The node monitors signals such as current from a CT and voltage from a PT, and based on the condition of the signals, controls the circuit breaker with which the node is associated. For example, if the node determines that the current exceeds a predetermined value, the node can control the circuit breaker to trip, i.e., open.

Industrial power distribution systems commonly divide incoming power into a number of branch circuits, where the branch circuits supply power to various equipment (i.e., loads) in an industrial facility. Circuit breakers are provided in each branch circuit to facilitate protection of equipment within the branch circuit. Accordingly, the switchgear system would include a plurality of nodes.

Switchgear systems are typically tested by applying or manipulating currents and voltages at or near normal operating levels. As such, the tests employ high current sources and high voltage sources, and test signals are injected at only one point in the system at a time. High voltage test equipment is typically expensive as compared to low voltage equipment. Also, high voltage testing presents more safety concerns to test personnel than ordinarily exist for low voltage testing. Furthermore, many tests require a part of the system, or perhaps the full system, to be taken off-line during the tests.

Some test solutions only establish a communication link with a device under test. For example, consider a test kit that interfaces with a trip unit under test via a three-wire digital communication link through a test jack on the trip unit. Such a test kit only allows for simulation of time-overcurrent conditions on a single breaker, and so it does not provide for testing of coordinated protection functions such as modified differential ground fault and bus differential. Furthermore, this type of test kit does not inject actual voltages or currents, but rather digital signals representing current or voltage levels. Also, some components, analog to digital converters for example, are not tested when communication link test methods are used. Consequently, this test kit alone does not fully exercise or test the trip unit.

SUMMARY OF THE INVENTION

There is provided a method of testing an electrical switchgear system. A node in the electrical switchgear system monitors a power line signal and controls a breaker based on the power line signal. The method includes applying an analog signal to the node, and receiving data representing a status of the breaker. The analog signal simulates the power line signal.

Another method of testing an electrical switchgear system includes: (a) applying a first analog signal to a first node in the electrical switchgear system, where the first node monitors a first power line signal and controls a first breaker based on the first power line signal, and where the first analog signal simulates the first power line signal; (b) applying, simultaneously with applying the first analog signal, a second analog signal to a second node in the electrical switchgear system, where the second node monitors a second power line signal and controls a second breaker based on the second power line signal, and where the second analog signal simulates the second power line signal; and (c) receiving data from the first node representing a status of the first breaker. The first analog signal has a magnitude of less than or equal to about 10% of a magnitude of the first power line signal.

There are also provided arrangements for testing an electrical switchgear system, and storage media that contain instructions for controlling a processor for testing an electrical switchgear system.

DESCRIPTION OF THE INVENTION

Figure 1:
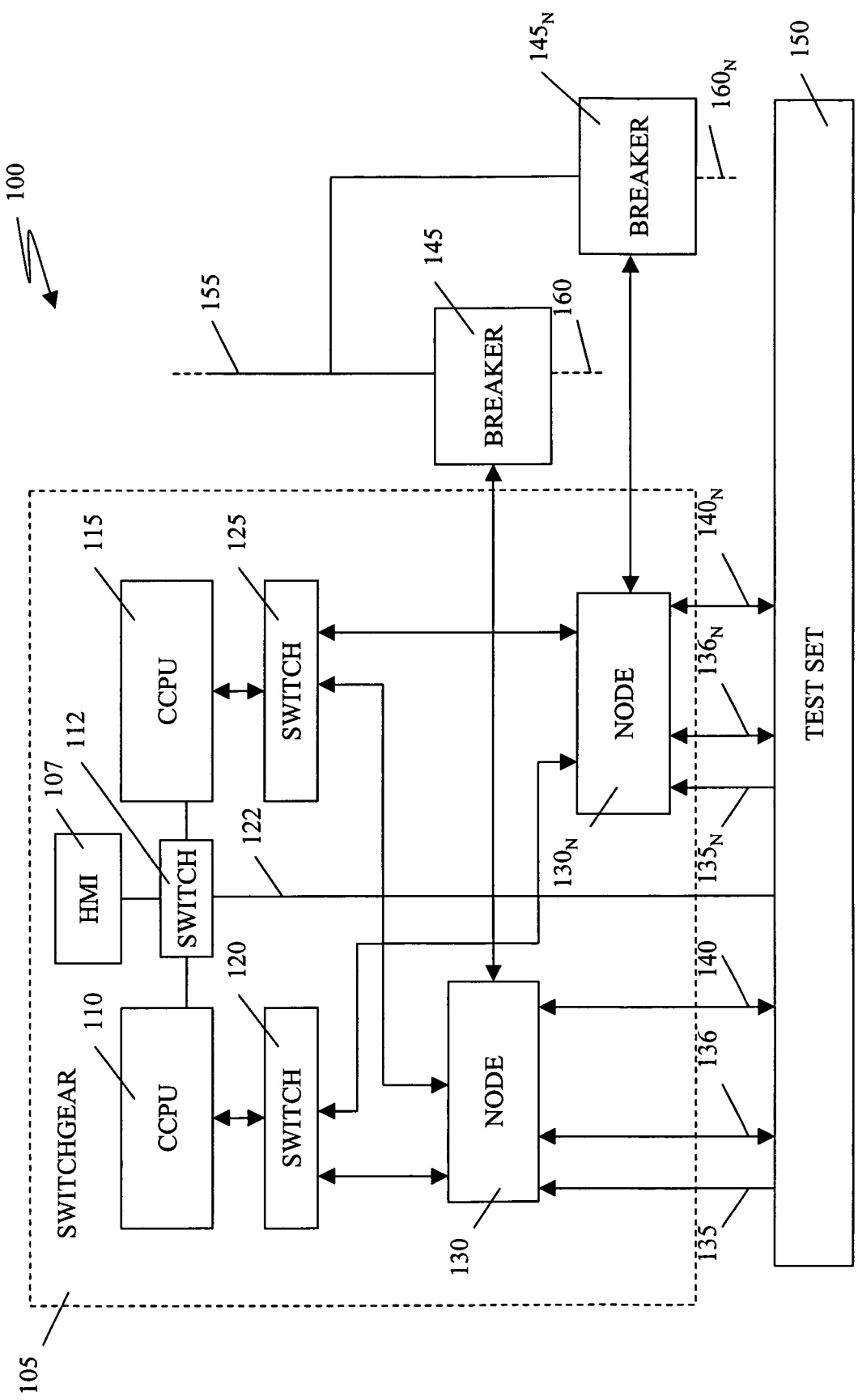
FIG. 1 is a block diagram of an electrical power distribution system that includes a switchgear system and a test set for testing the switchgear system.

FIG. 1 is a block diagram of an electrical power distribution system 100 that distributes power from a power bus 155 through a plurality of circuit breakers 145 and 145$_N$ to branch circuits 160 and 160$_N$, respectively. Electrical power distribution system 100 includes a switchgear system 105 and a test set 150 for testing switchgear system 105.

Switchgear system 105 is part of a centrally controlled and fully integrated protection, monitoring, and control protection system. Switchgear system 105 controls and monitors electrical power distribution system 100 from a pair of central control processing units (CCPU), namely CCPU 110 and CCPU 115. CCPUs 110 and 115 are connected to a human-machine interface (HMI) 107 via a switch 112. HMI 107 enables a user to communicate with, and thus control, switchgear system 105. Each of CCPU 110 and CCPU 115 also communicates, via a switch 120 or 125, respectively, with a plurality of nodes 130 and 130$_N$. Through switches 120 and 125, nodes 130 and 130$_N$ communicate substantially simultaneously with CCPUs 110 and 115.

CCPU 110 and CCPU 115, with their associated switches 120 and 125, are redundant of one another. This redundancy is provided for safety and reliability. Hereinafter, the present disclosure refers to a single CCPU, namely CCPU 110, with the understanding that its features and operations are applicable to both CCPU 110 and CCPU 115.

Node 130 monitors a power line signal corresponding to the operation of circuit breaker 145, sends data relating to the power line signal to CCPU 110, and controls circuit breaker 145 based on the power line signal. The power line signal represent various power line parameters, such as power, current, or voltage. The power line signals may be derived, for example, from current from a CT (not shown) and voltage from a PT (not shown). Based on the power line signals, node 130 can cause circuit breaker 145 to trip, thus removing power from branch circuit 160. CCPU 110, based on the data from node 130, can also cause circuit breaker 145 to trip, by sending an appropriate command to node 130.

Node 130 employs various circuit protection schemes, for example, ground-fault protection, over-current protection, over-voltage protection, under-voltage protection, and under-frequency/over-frequency protection. Node 130 can accept a command to either enable or disable a particular protection scheme. For example, node 130 can accept a command to disable the ground-fault protection capability. Also, node 130 can be controlled to enable or disable its breaker trip capability. That is, node 130 can be prevented from controlling circuit breaker 145 to open on a current fault. Generally, all features and capabilities of node 130 can be controlled to be either enabled or disabled.

Similarly, node $130_N$ monitors signals corresponding to the operation of circuit breaker $145_N$, and also sends data to CCPU 110. Each of node $130_N$ and CCPU 110 can cause circuit breaker $145_N$ to trip.

Thus, switchgear system 105 includes protection and control schemes that consider the value of electrical signals, such as current magnitude and phase, at one or both of circuit breakers 145 and $145_N$. Furthermore, switchgear system 105 integrates the protection, control, and monitoring functions of the individual circuit breakers 145 and $145_N$. That is, CCPU 110 receives a synchronized set of information available through digital communication with nodes 130 and $130_N$ and circuit breakers 145 and $145_N$ and so, CCPU 110 has the ability to operate these devices based on this complete set of data.

Test set 150 is an arrangement for testing components in electrical power distribution system 100. It provides analog signals 135 and analog signals $135_N$, to nodes 130 and $130_N$, respectively, and sends and receives digital signals 140 and $140_N$ to/from nodes 130 and $130_N$, respectively. Test set 150 is capable of communicating with nodes 130 and $130_N$ via a communication port, 136 and $136_N$, respectively. Exemplary embodiments of communication ports 136 and $136_N$ are RS232 and RS485 interfaces. Testing may involve a single node 130 or $130_N$, or it may involve both nodes 130 and $130_N$. Thus, test set 150 is capable of simultaneously testing a plurality of components in electrical power distribution system 100. More details regarding the operation of test set 150 are provided below, in a discussion of FIG. 2.

Although electrical power distribution system 100 is shown as having two nodes 130 and $130_N$, two circuit breakers 145 and $145_N$, and two branch circuits 160 and $160_N$, in practice, electrical power distribution system 100 may include any suitable plurality of these components. Accordingly, CCPU 110 would monitor and control such a plurality of components, and test set 150 would be configured to handle a commensurate plurality of analog signals 135 through $135_N$ and digital signals 140 through $140_N$.

Figure 2:
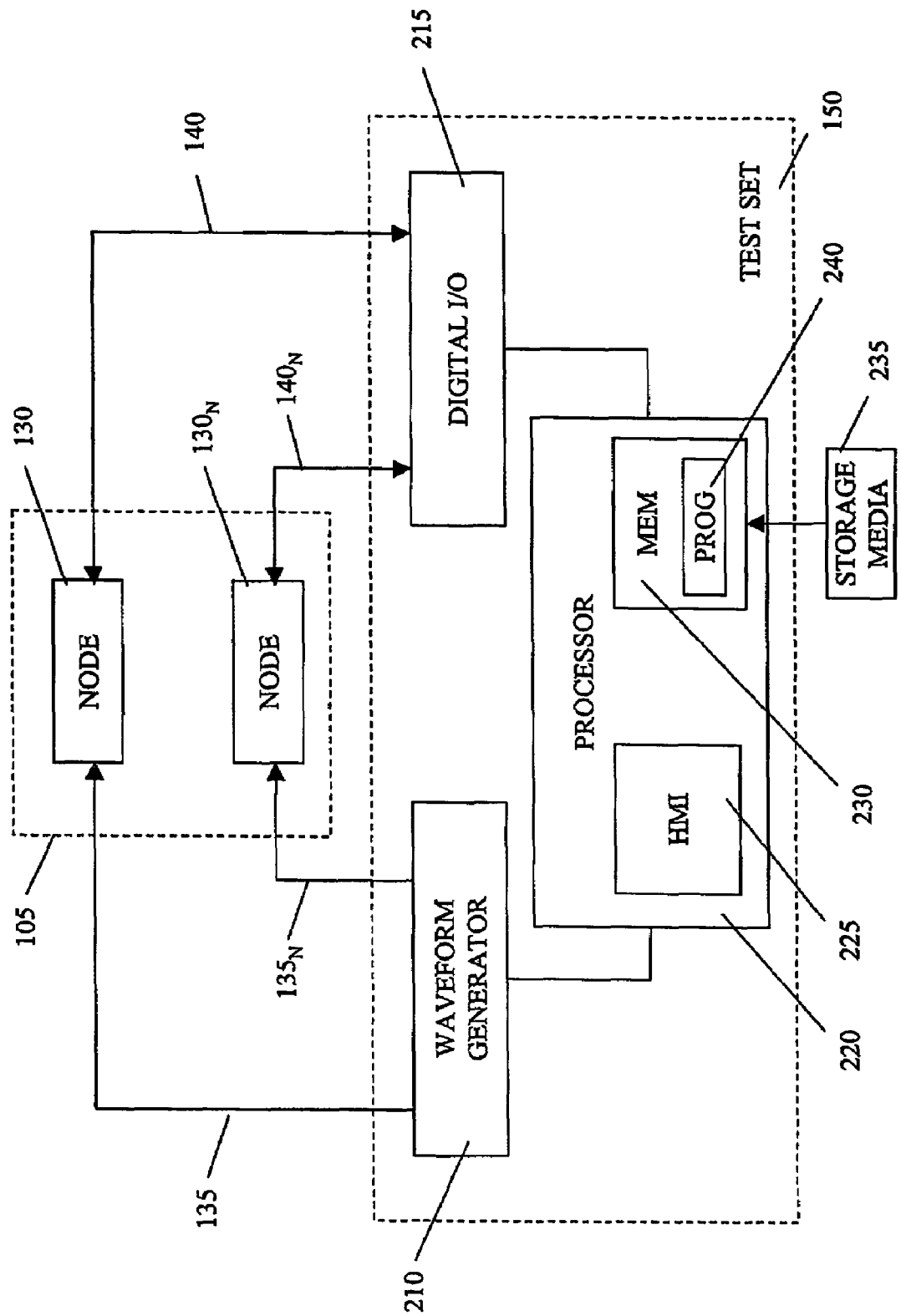
FIG. 2 is a block diagram of a portion of the electrical power distribution system of FIG. 1, showing the test set in greater detail.

FIG. 2 is a block diagram of a portion of the electrical power distribution system of FIG. 1, showing test set 150 in greater detail. FIG. 2 shows that test set 150 includes a waveform generator 210, a digital input/output (I/O) 215, and a processor 220.

Waveform generator 210 generates analog signals 135 and analog signals $135_N$ to simulate power line signals from CTs and PTs. Analog signals 135 and $135_N$ are low-level signals having magnitudes of less than or equal to about 10% of magnitudes of the power line signals being monitored by nodes 130 and $130_N$. In practice, it is desired for analog signals 135 and $135_N$ to have magnitudes of less than about 10 volts peak-to-peak, for example, 2.5 volts peak-to-peak. Analog signals 135 and $135_N$ are controlled with regard to parameters such as (1) phase, (2) magnitude, (3) frequency, (4) harmonics, and (5) dc offset. Analog signals 135 and $135_N$ may simulate either fault conditions or non-fault conditions of the power line signals. Waveform generator 210, although represented in FIG. 2 as being a single generator, may be configured as a plurality of subordinate generator modules, for example, a first generator module for analog signals 135, and a second generator module for analog signals $135_N$.

Nodes 130 and $130_N$ have special test ports for receiving analog signals 135 and $135_N$ and digital signals 140 and $140_N$. The test port on node 130, for example, can accept seven analog signals 135 and two digital signals 140 as inputs and send four digital signals 140 as outputs. Nodes 130 and $130_N$, and CCPU 110 use data collected from the analog signals 135 and $135_N$ in their primary protection algorithms.

Nodes 130 and $130_N$ have communication ports that can accept commands to enter test mode, overwrite and enable or disable ground fault protection, overwrite and enable or disable breaker 145 and $145_N$ tripping. Nodes 130 and $130_N$ can report status of all breaker 145 and $145_N$ signals including, but not limited to, open or close. Nodes 130 and $130_N$ can accept commands to configure the functionality of the digital interface signals 140 and $140_N$ from breaker actuator signals to breaker status signals.

In an exemplary embodiment, waveform generator 210 employs high speed, synchronized analog output boards (not shown) to generate analog signals 135 and $135_N$. Analog signals 135 and analog signals $135_N$ are routed to nodes 130 and $130_N$, respectively. For example, for node 130, waveform generator 210 may generate analog signals 135 to represent a 3-phase CT, a 3-phase PT and a neutral line (i.e., a total of seven signal lines). Waveform generator 210 can synchronize analog signals 135 and $135_N$ with one another, that is, to be switched ON and OFF simultaneously, or can control analog signals 135 and $135_N$ independently of one another. The parameters of analog signals 135 can be unique with respect to parameters of analog signals $135_N$.

Digital I/O 215 is an interface between (a) nodes 130 and $130_N$, and (b) processor 220. Digital I/O 215 passes control signals from processor 220 to nodes 130 and $130_N$, and passes data signals from nodes 130 and $130_N$ to processor 220. Digital I/O 215, although represented in FIG. 2 as being a single interface, may be configured as a plurality of subordinate interface modules, for example, a first interface module for digital signals 140, and a second interface module for digital signals $140_N$.

During a test, test set 150, and more specifically waveform generator 210, sends analog signals 135 and $135_N$ to nodes 130 and $130_N$. Test set 150 also, and more specifically digital I/O 215, sends commands among digital signals $140_N$ to nodes 130 and $130_N$. Test set 150 sends commands to node 130 via communication port 136.

Node 130 outputs a breaker status signal to indicate the status of circuit breaker 145, e.g., whether circuit breaker 145 is opened or closed. The breaker status signal from node 130 is included among digital signals 140. Thus, digital I/O 215 receives a breaker status signal from node 130 via digital signals 140. Digital I/O 215 time-stamps any state change in the breaker status signal, and sends the time-stamped signal to processor 220.

Processor 220 is a processor for controlling waveform generator 210 and digital I/O 215, and thus testing components in electrical power distribution system 100. It also maintains log files based on test parameters.

Processor 220 controls waveform generator 210 by defining the parameters for analog signals 135 and $135_N$, and defining durations of time that analog signals 135 and $135_N$ are active. Processor 220 determines a waveform or series of waveforms to be generated by waveform generator 210. For example, processor 220 may control waveform generator 210 to output a first waveform for a first duration and thereafter, output a second waveform of higher magnitude (or any different parameter) for a second duration.

Processor 220 defines the test parameters based on switchgear configuration data stored at CCPU 110 (FIG. 1). Test set 150 obtains the configuration data from CCPU 110, via switch 112, through a communication link 122 (FIG. 1).

Processor 220 controls digital I/O 215 to send/receive digital signals 140 and $140_N$. Thus, for example, via digital I/O 215, processor 220 may command node 130 to suspend ground-fault protection or suspend circuit breaker operation. More generally, via digital I/O 215, processor 220 can enable or disable any of the controllable operations of nodes 130 and $130_N$. Through digital I/O 215, processor 220 receives data that is output by nodes 130 and $130_N$ in the form of digital signals 140 and $140_N$.

Processor 220 has an associated HMI 225 and a memory 230. Processor 220 may be implemented on a general purpose microcomputer, such as one of the members of the Sun™ Microsystems family of computer systems, one of the members of the IBM™ Personal Computer family, or any conventional work-station or graphics computer device. Although processor 220 is represented herein as a standalone system, it is not limited to such, but instead can be coupled to other computer systems (not shown). HMI 225 and memory 230 may be sub-components of processor 220, or they may be remotely located from processor 220.

HMI 225 includes an input device, such as a keyboard or speech recognition subsystem, for enabling a user to communicate information and command selections to processor 220 for setting up various tests of electrical power distribution system 100 through test set 150. A cursor control such as a mouse, track-ball, or joystick, allows the user to manipulate a cursor on the display for communicating additional information and command selections to processor 220. HMI 225 also includes an output device such as a display or a printer for presenting test results and other information relating to test scenarios. For example, HMI 225 displays the output analog waveforms (i.e., analog signals 135 and $135_N$) and the response of a device under test (based on digital signals 140 and $140_N$ from nodes 130 and $130_N$). HMI 225 further include special monitoring equipment, such as a voltage meter or a current meter, for monitoring the test results.

Memory 230 is a memory for storing data and instructions for controlling the operation of processor 220. An exemplary implementation of memory 230 would include a random access memory (RAM), a hard drive and a read only memory (ROM). One of the components of memory 230 is a program 240.

Program 240 includes instructions for controlling processor 220 to test the components of electrical power distribution system 100. As a result of execution of program 240, processor 220, through its control of test set 150, applies analog signals 135 and $135_N$ to nodes 130 and $130_N$, and receives data from nodes 130 and $130_N$ representing statuses of circuit breakers 145 and $145_N$. Thus, the technical effect of program 240 is to test the components of electrical power distribution system 100. Program 240 may be implemented as a single module or as a plurality of modules that operate in cooperation with one another.

While program 240 is indicated as already being loaded into memory 230, it may be configured on a storage medium 235 for subsequent loading into memory 230. Storage medium 235 can be any conventional storage medium such as a magnetic tape, an optical storage medium, a compact disk, or a floppy disk. Alternatively, storage medium 235 can be a random access memory, or other type of electronic storage, located on a remote storage system.

Test set 150 uses a combination of software and high speed, synchronized analog output boards, to send low-level voltage signals, i.e., analog signals 135 and $135_N$, to either (a) individual electronic devices (e.g., node 130 or node $130_N$) or (b) simultaneously to a group of devices (e.g., nodes 130 and $130_N$), while at the same time accepting and responding to digital feedback signals, i.e., digital signals 140 and/or $140_N$, from nodes 130 and/or $130_N$. Test set 150 changes analog signals 135 and $135_N$ in response to the digital feedback. Each low-level voltage signal sent can be unique in phase, magnitude, harmonics, and DC offset and would simulate power line characteristics. Thus, analog signals 135 may be applied to node 130 to simulate a first power line signal, while simultaneously, analog signals $135_N$ are applied to node $130_N$ to simulate a second power line signal, and yet, analog signals 135 may be different from analog signals $135_N$. Feedback signals from nodes 130 and $130_N$ contain information such as status of circuit breakers 145 and $145_N$, that is time-stamped at state changes.

In some tests, the condition under which a protective feature of switchgear system 105 becomes engaged is important. Knowledge of a time at which the status of circuit breakers 145 and $145_N$ changes is useful for evaluating the condition under which the protective feature of switchgear system 105 becomes engaged. As such, test set 150 may modify analog signals 135 and $135_N$ based on the status of circuit breakers 145 and $145_N$, and then, as testing continues, test set 150 receives additional data representing the status of circuit breakers 145 and $145_N$.

Test set 150 can test the protection and control schemes of switchgear system 105. Single node tests include overcurrent protection (e.g., long time, short time, and instantaneous), ground fault protection, and single point protection relay functions (e.g., over voltage, under voltage, voltage imbalance, over frequency, and under frequency). Test set 150 can verify function and operation of trip unit (electronics) and trip coil, calibrate to time-current curve, check settings, and defeat ground fault protection. Testing of trip units is performed without high current injection equipment. For example, test set 150 can: (a) verify function/operation of electronics in nodes 130 and $130_N$, links between CCPU 110 and nodes 130 and $130_N$, and trip coils; (b) verify calibration of time-current curves (nodes 130 and $130_N$ and CCPU 110); and (c) check system configuration and settings; and issue control signals to nodes 130 and $130_N$, such as ground fault defeat and disable trip. Test set 150 can also test trip time curve for overcurrent protection, and relay protection, and can be employed for testing device electronics, configuration, calibration, communication links and metering Test set 150 also permits testing of electrical power distribution system 100 while electrical power distribution system 100 is providing protection, that is, while electrical power distribution system 100 is "racked-in" and "closed". All tests can be performed on live devices, which eliminates the need to shut down equipment for testing. For live testing, analog signals 135 and $135_N$ are provided while nodes 130 and $130_N$ monitor actual power line signals. That is, during live testing, nodes 130 and $130_N$ sample analog data from actual CT/PT inputs (i.e., from breakers 145 and $145_N$) and also from analog signals 135 and $135_N$, as provided by test set 150. The data from the actual CT/PT is used for protection purposes and can trip breakers 145 and $145_N$. Data from test set 150 is used to run the software protection algorithms but tripping the breaker is disabled through the use of control signals to nodes 130 and $130_N$. Digital signals 140 and $140_N$ sent to nodes 130 and $130_N$ from test set 150 can temporarily disable primary breaker tripping during testing, so as not to disrupt normal operation of electrical power distribution system 100. In order for switchgear system 105 to continue to provide fault protection during testing, back-up protection for nodes 130 and $130_N$ will operate normally regardless of digital signals 140 and $140_N$. For example, if an overcurrent event occurs in branch circuit 160 during testing, backup protection for node 130 will clear the fault using a secondary means to open breaker 145.

Since test set 150 is capable of synchronizing analog signals 135 and $135_N$, test set 150 is capable of testing more than one point in electrical power distribution system 100 simultaneously. Thus, test set 150 can perform synchronized testing of two or more electronic devices, as individuals or in groups connected within a system. That is, test set 150 can test (a) two or more devices that are separate, individual electronic devices, where an event on one device does not affect another device, or (b) two or more devices that are connected as a group within electrical power distribution system 100, where events on one or more devices can cause events on one or more other devices within electrical power distribution system 100. This capability allows for verification of multiple point relays and control schemes such as a modified differential ground fault relay function, a bus differential relay function, and a zone select interlock function.

The modified differential ground fault relay function provides the same protection function as a traditional ground fault, but is used in a system with multiple sources (and parallel sources). Such a system typically has a neutral tie bus and a common service-entrance ground, thus creating multiple, e.g., parallel, neutral current paths. The modified differential ground fault relay function combines imbalance currents from multiple points in the system to account for the multiple neutral currents.

The bus differential relay function provides a short time trip on detection of a bus differential. Given a plurality of breakers in a zone, the plurality of breakers can be configured to select which of the plurality of breakers will trip.

The zone select interlock function operates with a group of series-connected breakers, which are defined to form a sequence of zones. The most-upstream breaker is zone 0, while the feeders have the highest zone number. When a fault occurs on a downstream breaker, the upstream breaker is signaled and is restrained from tripping. The upstream breaker will then signal the zone above it to restrain it from tripping. For example, when a fault occurs in zone 3, a breaker in zone 2 is signaled and restrained from tripping.

One example of a single node test is a 135% Long Time Overcurrent Test. Test set 150 connects to node 130 and to switch 112. Test set 150 then obtains configuration and settings for node 130 and CCPU 110 through communication link 122. Based on the configuration of switchgear system 105, test set 150 calculates appropriate analog output levels and test duration times for the 135% Long Time Overcurrent Test. Test set 150 sets four analog signals 135 to represent CT signals (Phases A, B, C, and N) and three analog signals 135 to represent PT signals (Phases A, B, and C), for a total of seven analog signals 135. If desired, test set 150 can send a command to suspend ground fault protection at node 130 and/or a command to disable primary circuit breaker tripping at node 130. These commands are sent to node 130 via digital signals 140 or communication port 136.

When the 135% Long Time Overcurrent Test is executed, test set 150 outputs the seven analog signals 135 to node 130, simultaneously, while receiving status signals from node 130 via digital signals 140. Node 130 sends data derived from the seven analog signals 135 to CCPU 110. Node 130 and CCPU 110 perform algorithms on the data to determine an appropriate action, e.g., to trip circuit breaker 145. Test set 150 continues to output fault level analog signals 135 to node 130, until (a) the test times out or (b) a status signal from node 130 to the test set 150 changes state. If CCPU 110 decides to trip circuit breaker 145, CCPU 110 sends a command to node 130, which in turn sends a trip signal to circuit breaker 145 and a status signal to test set 150. When this status signal changes state, test set 150 changes analog signals 135 immediately to reflect a post fault current level. Test set 150 also time stamps when the trip status signal was received relative to the start of the test. This time stamp can be compared to a theoretical trip time to determine a pass or fail. Other digital signals 140 that could come from node 130 to test set 150 during this test include breaker secondary connect status, breaker primary disconnected status, and breaker contact status.

From these test results of the 135% Long Time Overcurrent Test, a user can determine whether (a) node 130 electronics are functioning/operating properly, (b) links between CCPU 110 and node 130 functions properly, (c) the trip coil that opens circuit breaker 145 is working and (d) node 130 is properly sending the control signal to operate the trip coil. Also, the user can verify the calibration of the time-current curve at node 130 and CCPU 110, and that proper settings are configured at node 130 and CCPU 110. If, during the test, circuit breaker 145 did not trip, then test set 150 would have continued to output the 135% fault level current until the test timed out. Time out time is set well beyond the expected trip time. If circuit breaker 145 does trip, then test set 150 immediately changes analog signals 135 to reflect post fault level signals (0 volts, 0 amperes).

An example of a multi-node test involves an upstream node and a downstream node. For this example, assume circuit breaker $145_N$ is an upstream breaker and circuit breaker 145 is a downstream breaker. For this test, test set 150 is connected to both node 130 and node $130_N$. Test set 150 is also connected to switch 112 via communication link 122, and gathers setting and configuration data concerning switchgear system 105. Using this data, test set 150 sets analog signals 135 and $135_N$ to nodes 130 and $130_N$, respectively. Say for instance, a user desires to create a short time overcurrent at circuit breaker 145 after some time t. For this, test set 150 outputs nominal analog signals 135 and $135_N$ to nodes 130 and $130_N$ for time t. At time t+1, test set 150 generates an appropriate short time overcurrent via analog signal 135 to node 130 while slightly increasing the level of analog signal $135_N$ to node $130_N$. These waveforms (analog signals 135 and $135_N$) will be outputted to nodes 130 and $130_N$ until (a) the test times out or (b) one of nodes 130 or $130_N$ sends a trip signal to its respective circuit breaker 145 or $145_N$. When node 130 or $130_N$ sends the trip signal to its respective circuit breaker 145 or $145_N$, node 130 or $130_N$ also sends a trip status signal to test set 150. In a successful test, circuit breaker 145 will have tripped. Also, trip time would be time stamped by test set 150 and can be compared to theoretical trip times to help determine pass or fail. At the point that circuit breaker 145 trips, test set 150 changes analog signals 135 and 135$_N$ to levels corresponding to post fault conditions, i.e. node 130 would receive analog signals 135 representing 0 volts and 0 amperes and node 130$_N$ would receive nominal analog signals 135$_N$.

What is claimed is:

1. A method of testing an electrical switchgear system, comprising:
   applying a first analog signal to a first node in said electrical switchgear system,
      wherein said first node monitors a first power line signal and controls a first breaker based on said first power line signal, and
      wherein said first analog signal simulates said first power line signal;
   applying, simultaneously with said applying said first analog signal, a second analog signal to a second node in said electrical switchgear system,
      wherein said second node monitors a second power line signal and controls a second breaker based on a second power line signal,
      wherein said second analog signal simulates said second power line signal, and
      wherein said first analog signal and said second analog signal, together, simulate a differential condition between said first power line signal and said second power line signal;
   receiving data indicative of a response of said electrical switchgear system to said first and second analog signals.

2. The method of claim 1, wherein said first analog signal has a magnitude of less than about 10 volts peak-to-peak.

3. The method of claim 1, wherein said first analog signal has a magnitude of about 2.5 volts peak-to-peak.

4. The method of claim 1, wherein said first analog signal has a magnitude of less than or equal to about 10% of a magnitude of said first power line signal.

5. The method of claim 1, wherein said applying said first analog signal is performed while said first node monitors said first power line signal.

6. The method of claim 1, wherein said first analog signal simulates a fault condition of said first power line signal.

7. The method of claim 1, wherein said first analog signal simulates a non-fault condition of said first power line signal.

8. The method of claim 1, further comprising:
   modifying said first analog signal based on said response; and
   receiving additional data representing a further response of said electrical switchgear system.

9. The method of claim 1, further comprising measuring a time required for the said first breaker to trip based on timestamps of said data.

10. The method of claim 1, wherein said first node continues to monitor said first power line signal and control said first breaker during said applying of said first analog signal.

11. An arrangement for testing an electrical switchgear system, comprising:
   a generator for:
      (a) applying a first analog signal to a first node in said electrical switchgear system,
         wherein said first node monitors a first power line signal and controls a first breaker based on said first power line signal, and
         wherein said first analog signal simulates said first power line signal; and
      (b) applying, simultaneously with said applying said first analog signal, a second analog signal to a second node in said electrical switchgear system.
         wherein said second node monitors a second power line signal and controls a second breaker based on said second power line signal.
         wherein said second analog signal simulates said second power line signal, and
         wherein said first analog signal and said second analog signal, together, simulate a differential condition between said first power line signal and said second power line signal; and
   an interface for receiving data indicative of a response of said electrical switchgear system to said first and second analog signals.

12. The arrangement of claim 11, wherein said first analog signal has a magnitude of less than about 10 volts peak-to-peak.

13. The arrangement of claim 11, wherein said first analog signal has a magnitude of about 2.5 volts peak-to-peak.

14. The arrangement of claim 11, wherein said first analog signal has a magnitude of less than or equal to about 10% of a magnitude of said first power line signal.

15. The arrangement of claim 11, wherein said generator applies said first analog signal while said first node monitors said first power line signal.

16. The arrangement of claim 11, wherein said first analog signal simulates a fault condition of said first power line signal.

17. The arrangement of claim 11, wherein said first analog signal simulates a non-fault condition of said first power line signal.

18. The arrangement of claim 11, wherein said arrangement:
   modifies said first analog signal based on said response; and
   receives additional data representing a further response of said electrical switchgear system.

19. The arrangement of claim 11, further comprising a processor for measuring a time required for the said first breaker to trip based on timestamps of said data.

20. The arrangement of claim 11, wherein said first node continues to monitor said first power line signal and control said first breaker during said applying of said first analog signal.

21. A storage medium comprising instructions for controlling a processor for testing an electrical switchgear system to:
   apply a first analog signal to a first node in said electrical switchgear system,
      wherein said first node monitors a first power line signal and controls a first breaker based on said first power line signal, and
      wherein said first analog signal simulates said first power line signal;
   apply, simultaneously with said applying said first analog signal, a second analog signal to a second node in said electrical switchgear system,
      wherein said second node monitors a second power line signal and controls a second breaker based on a second power line signal.
      wherein said second analog signal simulates said second power line signal, and wherein said first analog signal and said second analog signal, together, simulate a differential condition between said first power line signal and said second power line signal;

receive data indicative of a response of said electrical switchgear system to said first and second analog signals.

22. The storage media of claim 21, wherein said first node continues to monitor said first power line signal and control said first breaker during said applying of said first analog signal.

23. A system, comprising:

a first node that monitors a first power line signal and controls a first breaker based on said first power line signal;

a second node that monitors a second power line signal and controls a second breaker based on said second power line signal;

a generator for:

(a) applying a first analog signal to said first node, wherein said first analog signal simulates said first power line signal; and (b) applying, simultaneously with said applying said first analog signal, a second analog signal to said second node, wherein said second analog signal simulates said second power line signal, wherein said first analog signal and said second analog signal, together, simulate a differential condition between said first power line signal and said second power line signal; and an interface for receiving data indicative of a response of said electrical switchgear system to said first and second analog signals.

24. The system of claim 23, wherein said first node continues to monitor said first power line signal and control said first breaker during said applying of said first analog signal.

25. An arrangement for testing an electrical switchgear system, comprising:

(a) a generator for simultaneously applying:

(i) a first test signal to a first node in said electrical switchgear system, wherein said first node monitors a first power line signal and controls a first breaker based on said first power line signal; and (ii) a second test signal to a second node in said electrical switchgear system, wherein said second node monitors a second power line signal and controls a second breaker based on said second power line signal, wherein said first and second test signals, together, simulate event a fault in said electrical switchgear system that involves both of said first and second nodes;

(b) an interface for receiving data indicative of a response of said electrical switchgear system to said application of said first and second test signals; and (c) a processor that determines, from said data, whether said electrical switchgear system tripped said first and second breakers in a correct sequence.

26. The arrangement of claim 25, wherein said fault comprises a differential ground fault between said first power line signal and said second power line signal.

27. A system comprising:

(a) a first node that monitors a first power line signal and controls a first breaker based on said first power line signal;

(b) a second node that monitors a second power line signal and controls a second breaker based on said second power line signal;

(c) a switchgear processor that receives a first communication from said first node regarding said first power lines signal, receives a second communication from said second node regarding said second power line signal, and based on said first and second communications, controls said first and second nodes to co-ordinate said control of said first breaker and said control of said second breaker;

(d) a generator that simultaneously applies:

(i) a first test signal to said first node in said system; and (ii) a second test signal to said second node, wherein said first and second test signals, together, simulate a fault in said system that involves both of said first and second nodes;

(e) an interface that receives data indicative of a response of said system to said application of said first and second test signals; and (f) a test processor that determines, from said data, whether said system tripped said first and second breakers in a correct sequence.

28. The system of claim 27, wherein said fault comprises a differential ground fault between said first power line signal and said second power line signal.

* * * * *